United States Patent
Shibuya et al.

(10) Patent No.: US 8,252,118 B2
(45) Date of Patent: Aug. 28, 2012

(54) SUBSTRATE SUPPORT DEVICE AND PLASMA PROCESSING APPARATUS

(75) Inventors: Yohsuke Shibuya, Tokyo (JP); Yasuyuki Shirai, Tokyo (JP); Hirofumi Asanuma, Tokyo (JP); Junji Nakamura, Tokyo (JP)

(73) Assignee: Canon Anelva Corporation, Kawasaki-shi (JP)

( * ) Notice: Subject to any disclaimer, the term of this patent is extended or adjusted under 35 U.S.C. 154(b) by 615 days.

(21) Appl. No.: 12/423,235

(22) Filed: Apr. 14, 2009

(65) Prior Publication Data

US 2009/0308537 A1    Dec. 17, 2009

(30) Foreign Application Priority Data

Jun. 13, 2008 (JP) ................................. 2008-155060
Nov. 26, 2008 (JP) ................................. 2008-300906

(51) Int. Cl.
*H01L 21/306* (2006.01)
*C23C 16/44* (2006.01)

(52) U.S. Cl. .............. 118/728; 156/345.35; 156/345.51; 118/723 R; 204/298.15; 279/128; 361/234

(58) Field of Classification Search .............. 279/128; 361/234; 156/345.35, 345.51; 204/298.15; 118/728, 723 R
See application file for complete search history.

(56) References Cited

U.S. PATENT DOCUMENTS

| | | | | |
|---|---|---|---|---|
| 6,216,219 | B1 * | 4/2001 | Cai et al. ...................... | 712/207 |
| 6,432,208 | B1 | 8/2002 | Kawakami et al. ........... | 118/728 |
| 6,514,347 | B2 * | 2/2003 | Denpoh ...................... | 118/715 |
| 7,589,950 | B2 * | 9/2009 | Parkhe et al. ................. | 361/234 |
| 2009/0283976 | A1 * | 11/2009 | Kaneko et al. ................ | 279/128 |
| 2009/0308537 | A1 * | 12/2009 | Shibuya et al. ........... | 156/345.35 |

FOREIGN PATENT DOCUMENTS

JP          2000-299288       10/2000

* cited by examiner

*Primary Examiner* — Sylvia R. MacArthur

(74) *Attorney, Agent, or Firm* — Fitzpatrick, Cella, Harper & Scinto

(57) ABSTRACT

There is provided a substrate support device capable of preventing powder dust from being produced. A thermoconductive intermediate member is interposed between a base table and a substrate support table and has a communication aperture path for communicating the aperture path of the base table with the aperture path of the substrate support table. An elastic member such as bellows tube is disposed in the communication aperture path of the thermoconductive intermediate member, for insulating the thermoconductive intermediate member from the inert gas which flows through the communication aperture path.

9 Claims, 7 Drawing Sheets

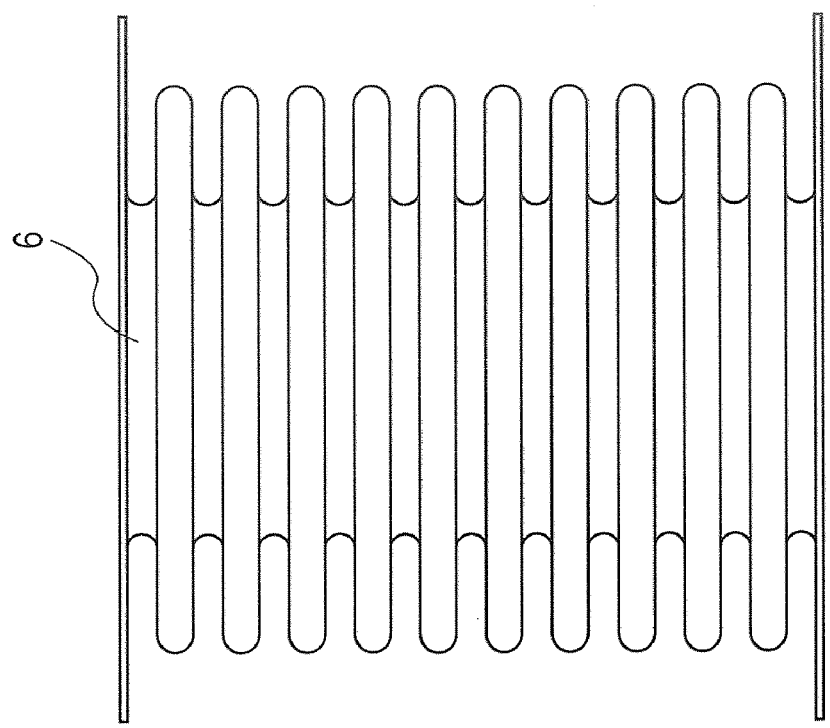
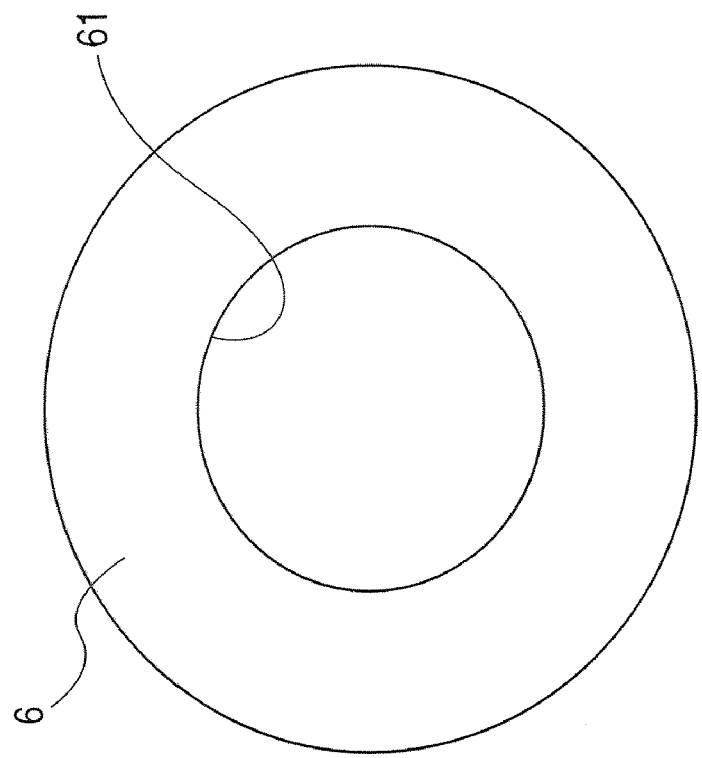

SUBSTRATE SUPPORT DEVICE AND PLASMA PROCESSING APPARATUS

CROSS-REFERENCES TO RELATED APPLICATIONS

This application claims the benefit of priorities from Japanese Patent Application No. 2008-155060 filed Jun. 13, 2008 and Japanese Patent Application No. 2008-300906 filed Nov. 26, 2008, the entire contents of which is incorporated herein by reference.

BACKGROUND OF THE INVENTION

1. Field of the Invention

The present invention relates to a substrate support device capable of supporting a substrate such as a semiconductor wafer with a temperature distribution of the substrate being uniformed and a plasma processing apparatus provided with the substrate support device in a process chamber the inside atmosphere of which can be evacuated into a vacuum.

2. Related Background Art

Until now there has been proposed various techniques for supporting a substrate in the process of etching, CVD and sputtering.

For example, there has been proposed a substrate support device whose placing table on which a substrate is placed has an electrostatic adhesion mechanism for adhesively holding the substrate by an electrostatic force (refer to Japanese Patent Application Laid-Open No. 2000-299288). The substrate support device is provided with a base table having a cooling means on the other side of the placing table of the substrate to enable the placing table to be cooled to a predetermined temperature.

The surface of the placing table is formed in an uneven shape to produce a gap between the placing table and the substrate placed thereon. An inert gas is circulated between the gap to uniform the temperature of the substrate, preventing film-forming and etching conditions from being uneven on the whole substrate. Similarly, in order to uniform the temperature on the whole substrate, there is interposed a carbon sheet high in thermal conductivity between the base table and the placing table.

[Patent Reference 1] Japanese Laid-Open Gazette No. 2000-299288A

The substrate support device disclosed in Japanese Patent Application Laid-Open No. 2000-299288 interposes the carbon sheet high in thermal conductivity between the base table and the placing table to uniform the temperature distribution on the substrate, however there is a problem in that a carbon sheet is prone to produce powder dust.

In other words, there needs to be provided a flow path for the inert gas passing though the carbon sheet interposed between the base table and the placing table in order to supply the inert gas to the surface of the placing table. In this case, the inert gas may convey carbon powder to the other side of the substrate. If such a phenomenon occurs, the other side of the substrate cannot be maintained to a predetermined pressure even if the inert gas is circulated, which prevents temperature from being uniformed.

In addition, an adverse influence may be exerted such as the production of particles due to contamination in the chamber and the lowering of ultimate vacuum.

The present invention has been made in view of the above circumstances and the object of the present invention is to provide a substrate support device capable of preventing powder dust from being produced to uniform temperature on a substrate and a plasma processing apparatus provided with the substrate support device.

SUMMARY OF THE INVENTION

In order to achieve the above object, according to the present invention, a substrate support device provided with a structure for supplying an inert gas to an rear face of a substrate includes; a base table having an aperture path which penetrates the base table and is communicated with a flow path of the inert gas, a substrate support table disposed on the base table and having an aperture path which penetrates the substrate support table, a thermoconductive intermediate member interposed between the base table and the substrate support table and having a communication aperture path for communicating the aperture path of the base table with the aperture path of the substrate support table, and an elastic member disposed in the communication aperture path of the thermoconductive intermediate member, for insulating the thermoconductive intermediate member from the inert gas which flows through the communication aperture path.

One aspect of a substrate support device set inside a vacuum chamber in plasma processing apparatus includes; a base table provided with a gas flow outlet, a substrate support table disposed on the base table, for supporting a substrate on the front surface thereof, wherein a first aperture path penetrates the substrate support table from the rear surface to the front surface of the substrate support table, and a carbon sheet member disposed between the base table and the substrate support table, wherein a second aperture path penetrates the carbon sheet from the rear surface to the front surface of the carbon sheet to communicate the gas flow outlet of the base table with the first aperture path of the substrate support table, wherein on the inside wall of the second aperture path, a tube-like metal member which has an elastic coefficient in the thickness direction of the said carbon sheet member smaller than that of the carbon sheet member, is put, whereby when a gas flows from the gas flow outlet of the base table through the first aperture path of the substrate support table and then is spouted out onto the front surface of the substrate support table, flowing gas does not contact with the carbon sheet member.

The base table includes heating means, the substrate support table includes an electrostatic chuck for electrostatically adsorbing the substrate, the surface of the substrate support table is uneven, the gas ejected from the second aperture path is circulated to the gap between the substrate and the substrate support table when the substrate is adsorbed onto the substrate support table by the electrostatic chuck. The tube-like metal member is a metallic tube in bellows.

According to the present invention, the elastic member provides the communication aperture path, serving as a flow path for the gas, for causing the aperture path of the base table to communicate with that of the substrate support table and insulates the intermediate member from the communication aperture path. This prevents powder dust produced in the intermediate member by the gas from being conveyed to the opposite side of the substrate to maintain the opposite side of the substrate at a predetermined pressure, enabling the temperature on the substrate to be uniformed.

BRIEF DESCRIPTION OF THE DRAWINGS

FIG. 5A is a plan view of a micro bellows according to the present embodiment.

FIG. 5B is a side view of the micro bellows.

DETAILED DESCRIPTION OF THE EMBODIMENTS

The embodiments of the present invention are described below with reference to the drawings. The present invention is not limited to the embodiments.

[First Embodiment]

Figure 1:
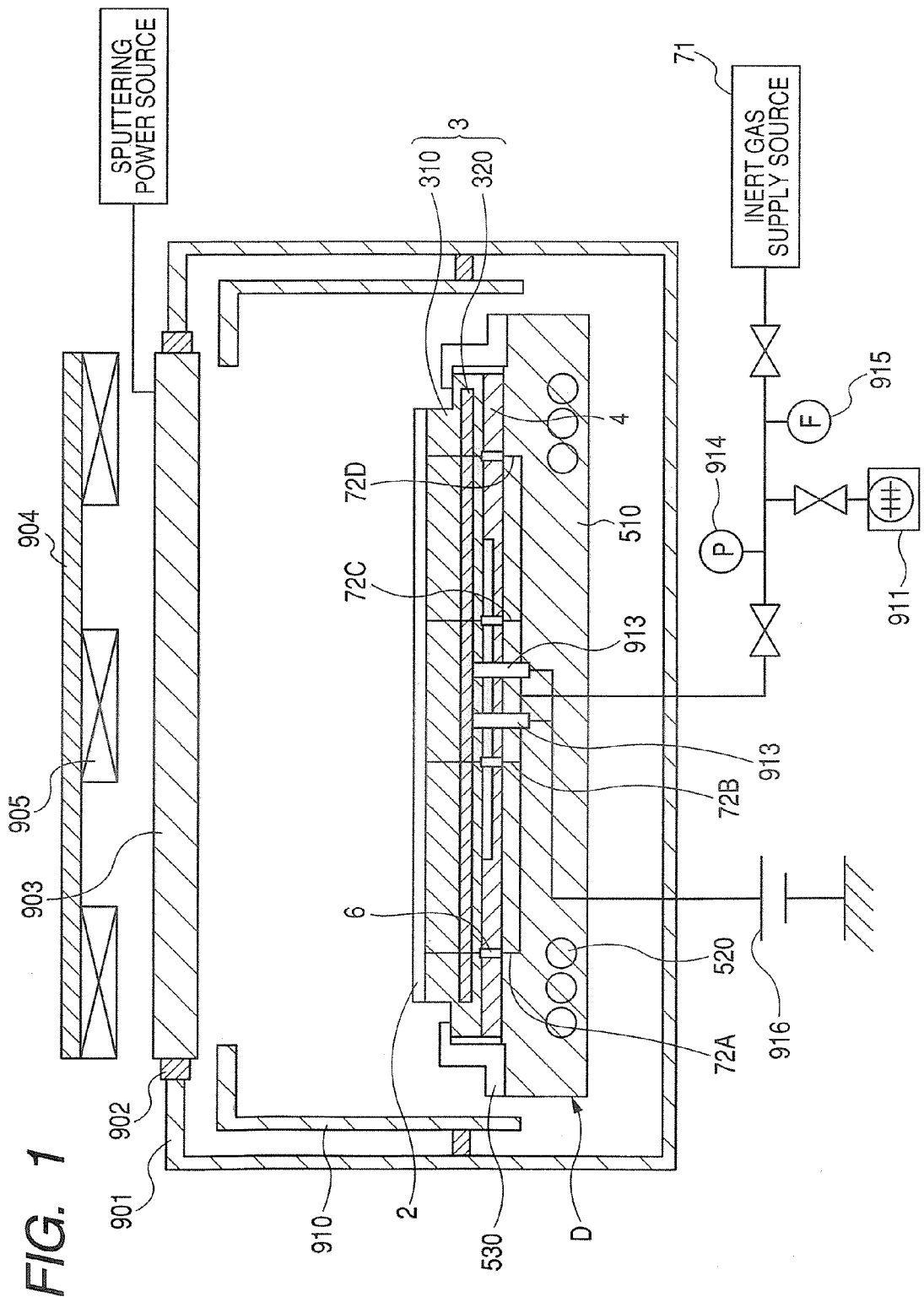
FIG. 1 is a schematic diagram illustrating a general configuration of a sputtering apparatus provided with a substrate support device according to the present invention.
Figure 2A:
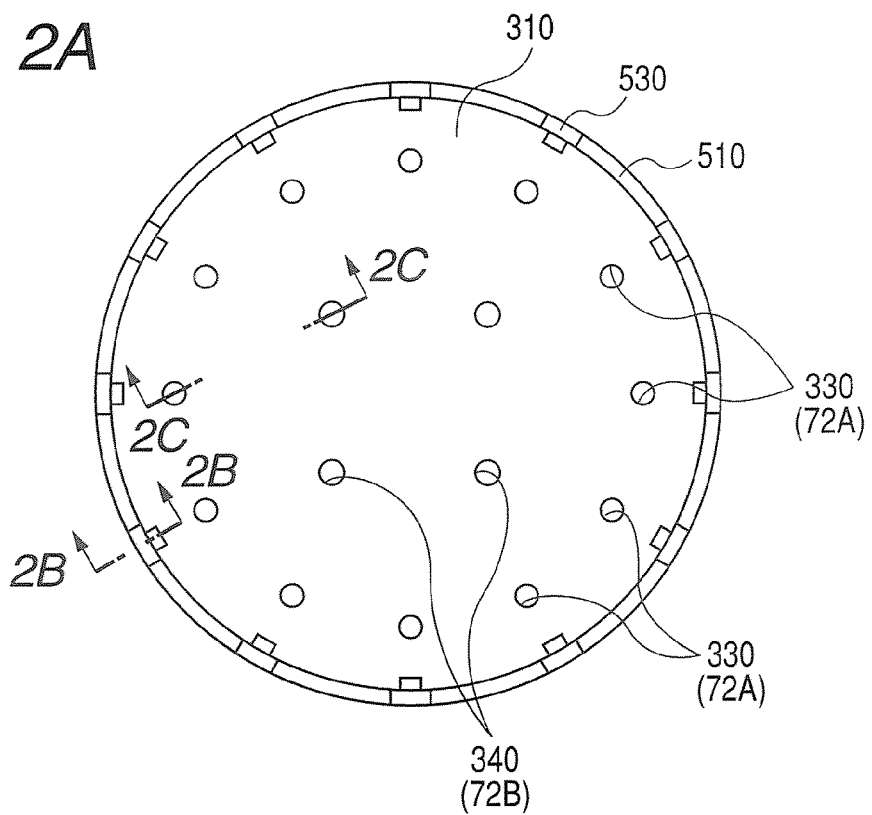
FIG. 2A is a schematic plan view of the substrate support device according to the first embodiment.
Figure 2B:
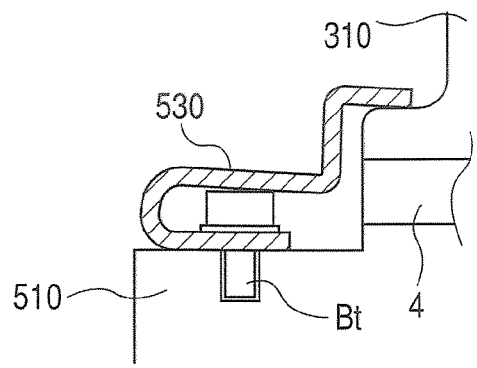
FIG. 2B is a cross section taken along a line B-B of FIG. 2A.
Figure 2C:
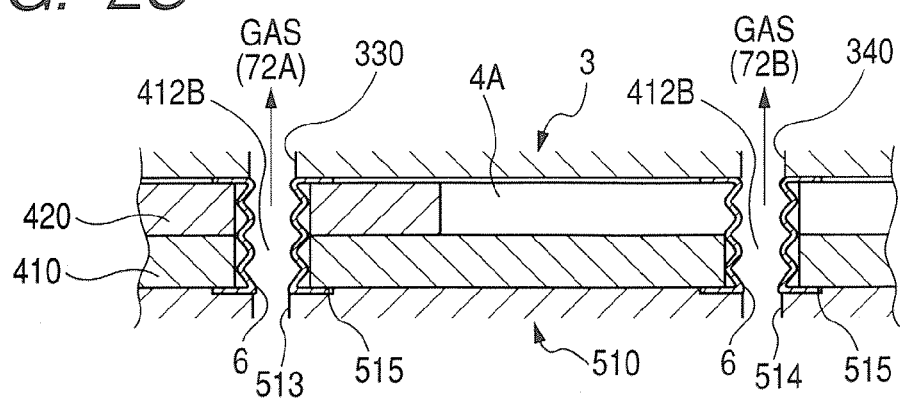
FIG. 2C is a schematic cross section taken along a line C-C of FIG. 2A.
Figure 3:
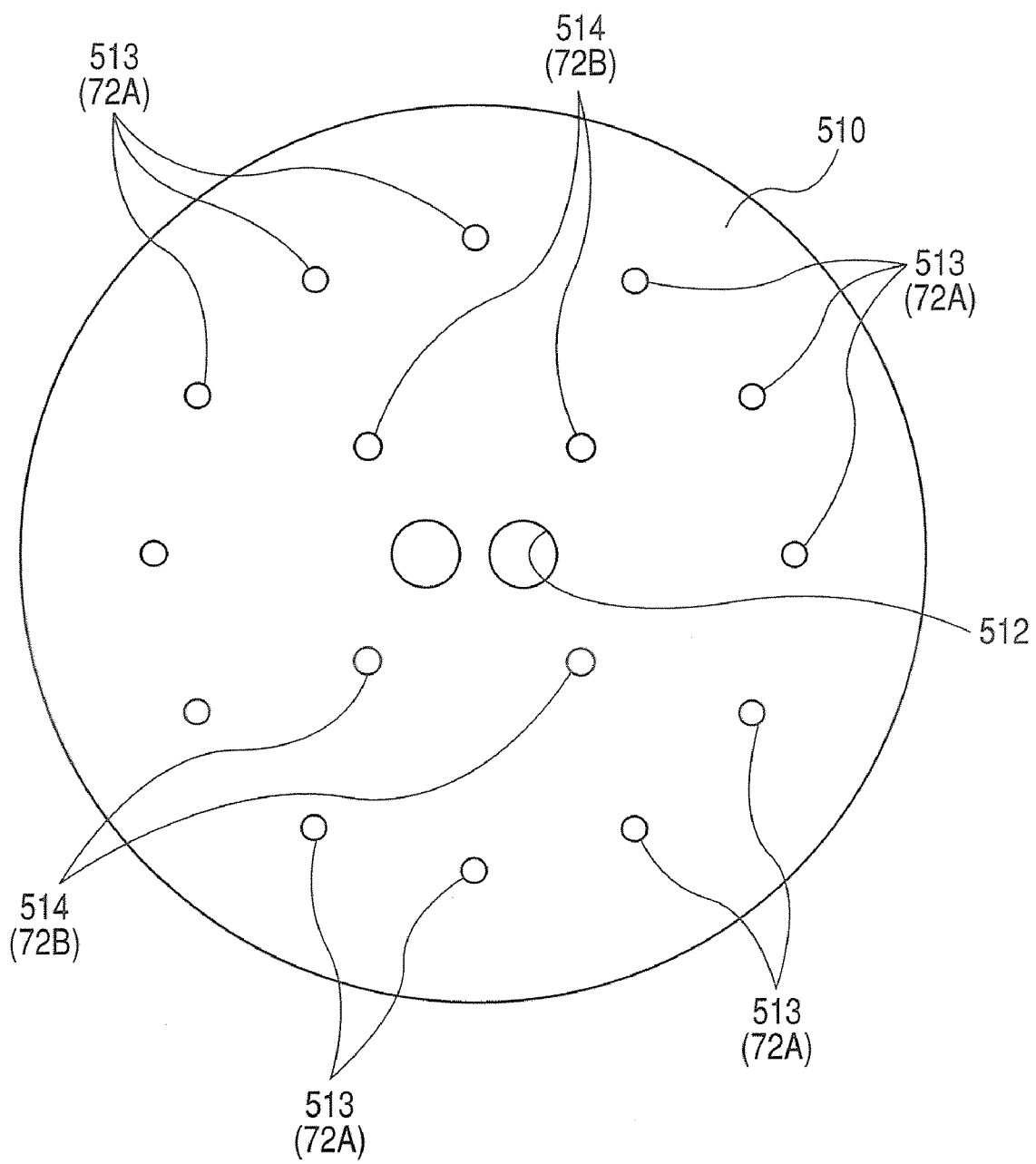
FIG. 3 is a plan view illustrating a base table of the present embodiment.
Figure 4B:
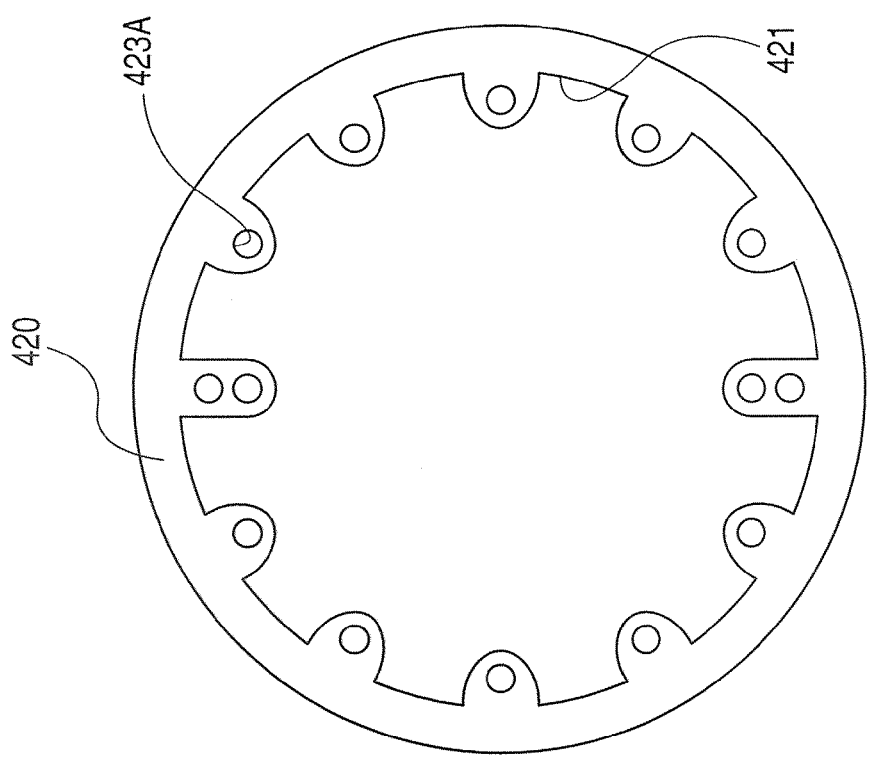
FIG. 4B is a plan view of an upper carbon sheet.
Figure 4A:
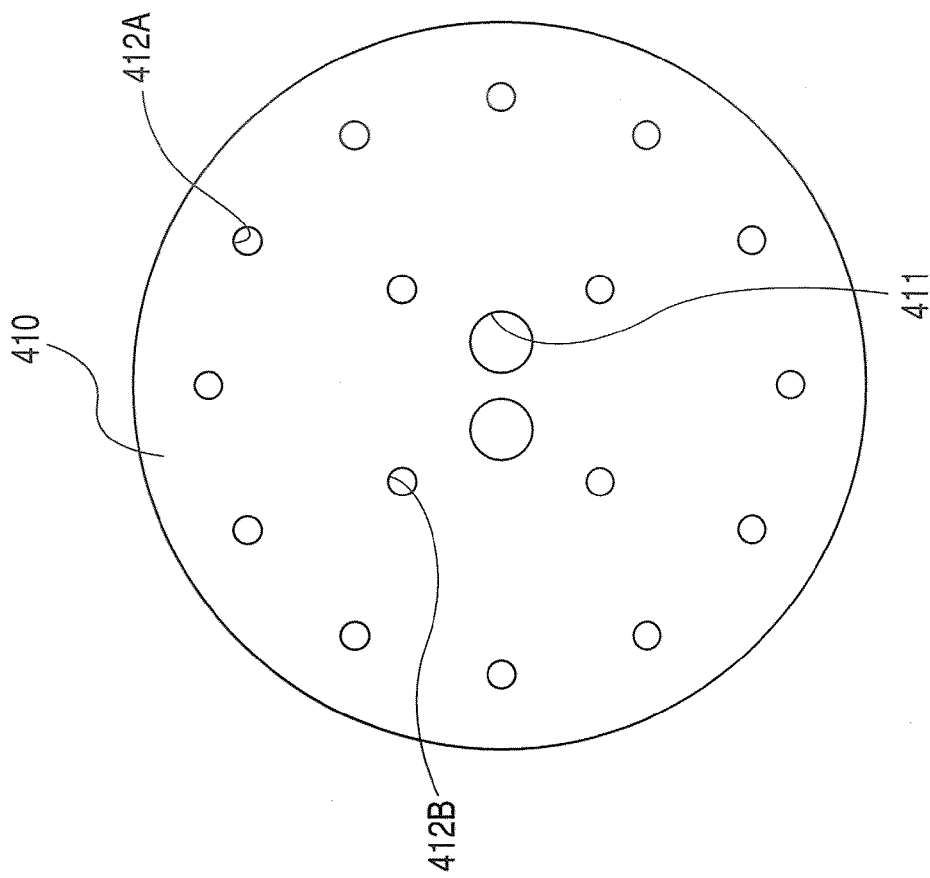
FIG. 4A is a plan view of a lower carbon sheet forming an intermediate member according to the present embodiment.

FIG. 1 is a schematic diagram illustrating a general configuration of a sputtering apparatus provided with the substrate support device according to the present invention. FIG. 2A is a schematic plan view of the substrate support device according to the first embodiment. FIG. 2B is a cross section taken along a line B-B of FIG. 2A. FIG. 2C is a schematic cross section taken along a line C-C of FIG. 2A. FIG. 3 is a plan view illustrating a base table of the present embodiment. FIG. 4A is a plan view of a lower carbon sheet forming an intermediate member according to the present embodiment. FIG. 4B is a plan view of an upper carbon sheet forming the same. FIG. 5A is a plan view of a micro bellows according to the present embodiment. FIG. 5B is a side view of the micro bellows.

FIG. 1 exemplifies a sputtering apparatus used as a plasma processing apparatus according to the present invention. The sputtering apparatus includes a process chamber 901 which can be evacuated by a vacuum pump 911 to a predetermined degree of vacuum.

A target 903 is provided on the ceiling portion of the process chamber 901 through an annular insulating member 902 and a substrate support device D for supporting a substrate 2 is provided in a position opposed to the target 903.

A yoke board 904 is provided on the other side of the target 903 and a magnet 905 is fixed to the yoke board. The magnet 905 generates a magnetic field for forming a high density plasma on the target 903. A sputtering power source is connected to the target 903 and applies a high frequency power superimposed on a DC power to the target 903 at the time of forming film. The substrate 2 is placed on the substrate support device D through a slit valve (not shown) provided in the process chamber 901.

The substrate support device D includes an electrostatic chuck 3 serving as a substrate support table for holding the substrate 2 by adsorption action, a base table 510 for supporting the electrostatic chuck 3 and flow paths 72A and 72B for an inert gas (Ar gas, for example) supplied to the rear face of the substrate 2 held by adsorption action to the electrostatic chuck 3. In addition, the substrate support device D further includes a thermoconductive intermediate member 4 more elastic than the base table 510 and the electrostatic chuck 3 between the electrostatic chuck 3 and the base table 510 and a plurality of micro bellows 6 being an elastic member.

The electrostatic chuck 3 in the present embodiment operates on a single-pole adsorption principle and includes a disk-shaped dielectric plate 310 and a single electrode 320 provided inside the dielectric plate 310. The electrode 320 is electrically connected by the single-pole adsorption principle to a DC power source for electrostatic adsorption 916 for supplying DC voltage used for electrostatic adsorption through conductive rods 913 and supplied with a predetermined positive or negative voltage. The dielectric plate 310 is formed of a dielectric such as ceramics and generates an electrostatic force when a voltage is applied to the electrode 320 to hold the substrate 2 by adsorption action. Incidentally, the present invention is not limited to an adsorption principle, but a bipolar electrostatic chuck may be used.

As illustrated in FIG. 2A, the electrostatic chuck 3 has a plurality of aperture paths 330 and 340 which penetrate the surface of the dielectric plate 310. The plurality of aperture paths 330 and 340 are formed both at the outer and the inner periphery. The plurality of aperture paths 330 formed at equally spaced intervals on a circle of the outer periphery form a part of a flow path 72A (hereinafter sometimes referred to as "outer periphery flow path") for supplying an inert gas to the outer periphery on the rear surface of the substrate 2. Similarly, the plurality of aperture paths 340 formed at equally spaced intervals on a circle of the inner periphery form a part of a flow path 72B (hereinafter sometimes referred to as "inner periphery flow path") for supplying an inert gas to the inner periphery on the rear surface of the substrate 2.

Although not illustrated, the entire surface of the dielectric plate 310 is uneven. The protrusion holds the substrate 2 by adsorption action. The inert gas supplied from the flow paths 72A to 72D flows along the recess to spread over the rear surface of the substrate 2.

The base table 510 is made of a material such as stainless steel (SUS) or copper (Cu) which is excellent in thermal conductivity and heat resistant. Heating means 520 such as a sheath heater is provided inside the base table 510 to heat the base table at a predetermined temperature at the time of forming film. In addition, a temperature sensor (not shown) for detecting temperature is provided inside the base table 510. The output terminal of the temperature sensor is electrically connected to the temperature control unit of an external unit (not shown) to transmit a temperature detection signal. The temperature control unit controls the output of heating electric power supplied to the base table 510 based on the temperature detection signal by a predetermined feedback control system, i.e., a PID control system.

A plurality of fixing springs 530 are fixed to the surface of the outer periphery of the base table 510. In FIGS. 2A and 2B, the plurality of fixing springs 530 are fixed to the entire surface of the outer periphery of the base table 510 at equally spaced intervals using bolts Bt. The fixing springs 530 are curved leaf spring materials for depressing the electrostatic chuck 3 against the surface of the base table 510.

As illustrated in FIG. 3, the base table 510 has a plurality of aperture paths 513 and 514 which communicate with a plurality of aperture paths 330 and 340 formed in the electrostatic chuck 3. The aperture paths are formed both at the outer and the inner periphery. The plurality of aperture paths 513 formed at equally spaced intervals on a circle of the outer periphery form a part of the outer periphery flow path 72A. The plurality of aperture paths 514 formed at equally spaced intervals on a circle of the inner periphery form a part of the inner periphery flow path 72B. Two aperture paths which penetrate the center of FIG. 3 are aperture paths 512 for conductor rods through which the conductive rods 913 are inserted.

The flow paths 72A to 72D are connected to an inert gas supply source 71 illustrated in FIG. 1. There are provided a gas flow meter 915 required for supplying the gas at a predetermined flow rate and a pressure gauge 914 for monitoring the pressure of the inert gas to be supplied. During film forming, the inert gas supply source 71 supplies the inert gas to the inner and the outer periphery on the rear surface of the substrate 2 through the flow paths 72A to 72D to perform a heat exchange between the electrostatic chuck 3 and the substrate 2.

In the present embodiment, as described above, the base table 510 is heated. The heat transferred from the base table 510 to the electrostatic chuck 3 is further transferred to the substrate 2 through the inert gas to control the substrate 2 at the predetermined temperature. At this point, the pressure of the inert gas is controlled based on measurements of the pressure gauge 914 to control a thermal resistance of the gap or the contact surface between the electrostatic chuck 3 and the substrate 2, enabling a temperature of the substrate 2 to be controlled.

The micro bellows 6 in the intermediate member 4 and the flow paths 72A to 72D are used to join the electrostatic chuck 3 to the base table 510. The use of a material with the elasticity of those components allows joining the electrostatic chuck 3 to the base table 510 which are different in thermal expansion characteristics without the electrostatic chuck 3 and the base table 510 being deformed.

In the present embodiment, the intermediate member 4 uses a thermo conductive member which is brought into face-to-face contact with the base table 510 and the electrostatic chuck 3 to transfer heat. As the intermediate member 4, there may be preferably used a member excellent in thermal conductivity and adhesion. In the present embodiment, the intermediate member 4 uses an elastic material to generate surface pressure between the base table 510 and the electrostatic chuck 3, sealing the inert gas passing through the flow paths 72A to 72D. In the present embodiment, the central portion of the intermediate member 4 is recessed, so that the inner side of the intermediate member 4 is smaller in elastic coefficient.

As illustrated in FIGS. 4A and 4B, the intermediate member 4 in the present embodiment includes a lower carbon sheet 410 disposed on the base table 510 and an upper carbon sheet 420 laid on the lower carbon sheet 410. The carbon sheet is a sheet member containing graphite. For example, graphite is subjected to acid treatment to produce expanded graphite and then roll it to a sheet.

The lower carbon sheet 410 is circular and slightly smaller in diameter than the base table 510. Aperture paths for conductive rods 411 through which the conductive rods 913 are inserted are formed at the center thereof. At positions continuous to the aperture paths 513 and 514 of the base table 510, there formed aperture paths for bellows 412A and 412B which are slightly larger in diameter than the aperture paths 513 and 514.

The upper carbon sheet 420 is substantially annular and the outer diameter thereof is the same as the diameter of the lower carbon sheet 410. The central portion of the carbon sheet 4 is recessed. An inner circumferential end 421 intermittently protrudes to the periphery of position continuous to the aperture path for bellows 412A of the lower carbon sheet 410. At the protruded portion, there is formed an aperture path for bellows 423A continuous to the aperture path for bellows 412A of the lower carbon sheet 410. In the present embodiment, the carbon sheet 410 is the same as the carbon sheet 420 in thickness. Stacking upper carbon sheet 420 on the lower carbon sheet 410, as illustrated in FIG. 2C, forms a substantially circular recess 4A at the center.

As illustrated in FIG. 2C, inside the aperture paths for bellows 412A, 412B and 423A of the carbon sheet, there is disposed the micro bellows 6 as an elastic member as illustrated in FIGS. 5A and 5B. The micro bellows 6 is a metallic tube in bellows stretchable in the height direction. The micro bellows 6 can be formed by subjecting metal high in melting-point, for example, nickel (Ni) to electrodeposition. For example, a micro bellows with an inner diameter of 2.3 mm, a length of 5.7 mm and an amount of stretch of 0.75 mm may be uses as the micro bellows 6 in the present embodiment. The material for the micro bellows 6 is not limited to metal high in melting-point, but synthetic rubber or synthetic resin may be used. However, if the micro bellows is used at a high temperature, it is preferably metallic.

The micro bellows 6 are designed to be thicker than the intermediate member 4 in height and disposed inside the aperture paths for bellows 412A, 412B and 423A with the micro bellows being elastically deformed. The hollow portion 61 of the micro bellows 6 couples the aperture path of the base table 510 to that of the electrostatic chuck 3 and forms a part of the flow paths 72A and 72B. A countersunk hole 515 is formed at a part of the base table 510 on which the micro bellows 6 is disposed. The micro bellows 6 is fitted into the countersunk hole 515.

The elastic member does not always need to be formed in bellows like the micro bellows 6 as long as it is an elastic body that may be a cylindrical leaf spring. The elastic member does not always need to have so strong elastic force as to generate a surface pressure strong enough to seal the inert gas, but it is enough if the elastic member can follow change in gap between the base table 510 and the electrostatic chuck 3. The elastic member is preferably smaller than intermediate member 4 in elastic coefficient so that the elastic member satisfactorily follows change in gap between the base table 510 and the electrostatic chuck 3.

There is described below the operation of the substrate support device D according to the present embodiment.

Before the base table 510 is heated, for example, before a film-forming process, in the substrate support device D, the periphery of the intermediate member 4 and the electrostatic chuck 3 is tightly depressed on and fixed to the base table 510 by fixing the springs 530. In this state, the intermediate member 4 maintains the gap created by the recess 4A as is between the electrostatic chuck 3 and the base table 510 and the micro bellows 6 is maintained with the micro bellows 6 deformed to height of two carbon sheets 410 and 420.

At the time of starting the film-forming process, the base table 510 is heated to a predetermined temperature and the inert gas is supplied from the inert gas supply source 71. At this point, the carbon sheets 410 and 420 transfer heat from the base table 510 to the electrostatic chuck 3. The inert gas passes through the flow paths 72A and 72B and is circulated to the whole rear surface of the substrate 2 to transfer heat from the electrostatic chuck 3 to the substrate 2. Thus, the use of the intermediate member 4 and the inert gas increases a heat transfer coefficient to enable an excellently responsive and accurate temperature control.

The flow paths 72A to 72D in the electrostatic chuck 3 and the base table 510 as well as a portion where the gap is created between the intermediate member 4 and the electrostatic chuck 3, are coupled by the micro bellows 6. This prevent powder dust of carbon (C) constituting the carbon sheets 410 and 420 from detouring the substrate 2 to its rear surface, thereby avoiding generation of impurities and deterioration in temperature control at the time of forming film.

The inert gas is sealed by surface pressure generated by the intermediate member 4 between the base table 510 and the electrostatic chuck 3. As described above, the protruded portion of the inner circumferential end 421 of the upper carbon sheet 420 is configured to cover the periphery of the micro bellows 6 forming the outer periphery flow path 72A, the inert gas is completely sealed.

Heating the base table 510 warps upward the inner periphery thereof due to difference in thermal expansion between the outer and the inner periphery thereof (or warps downward the outer periphery thereof). At this point, the base table 510 is separated from the electrostatic chuck 3 at the outer periphery if the whole intermediate member 4 is uniform in thickness, so that heat is not transferred at the outer periphery, which makes temperature uneven between the inner and the outer periphery of the substrate 2.

In the present embodiment, if the inner periphery of the base table 510 warps upward, the gap previously created in the vicinity of the center of the intermediate member 4 by the recess 4A thereof is collapsed, and the intermediate member 4 is brought into close contact with the base table 510 and the electrostatic chuck 3 on its whole surface including the vicinity of the center. Thereby, heat is uniformly transferred both at the inner and at the outer periphery, preventing the temperature distribution from becoming uneven.

At this point, the micro bellows 6 disposed at the recess 4A is compressed by height of the recess 4A. The micro bellows 6 is made of a material in bellows, so that the amount of stretch and shrinkage can be increased and therefore the micro bellows 6 may not be broken or plastically deformed, for example.

Since the recess 4A never remains as a space and follows deformation, the intermediate member 4 can be brought into complete contact with the base table 510 and the electrostatic chuck 3 on its whole surface to contribute to the uniform of temperature. The micro bellows 6 is small in radial deformation when compressed, so that the micro bellows 6 does not deteriorate controllability of gas pressure attributed to the flow paths 72A and 72B being blocked by the deformation.

According to the substrate support device D of the first embodiment described above, the micro bellows 6 provide communication aperture paths serving as flow paths 72A to 72D for the inert gas, which cause the aperture paths 513 and 514 of the base table 510 to communicate with the aperture paths 330 and 340 of the electrostatic chuck 3. In addition, the micro bellows 6 separate the communication aperture paths from the carbon sheets 410 and 420. This prevents carbon powder produced by the inert gas from being conveyed to the rear surface of the substrate 2, so that a pressure over the rear surface of the substrate 2 can be remained within a predetermined pressure to uniform the temperature of the substrate.

[Second Embodiment]

Figure 6:
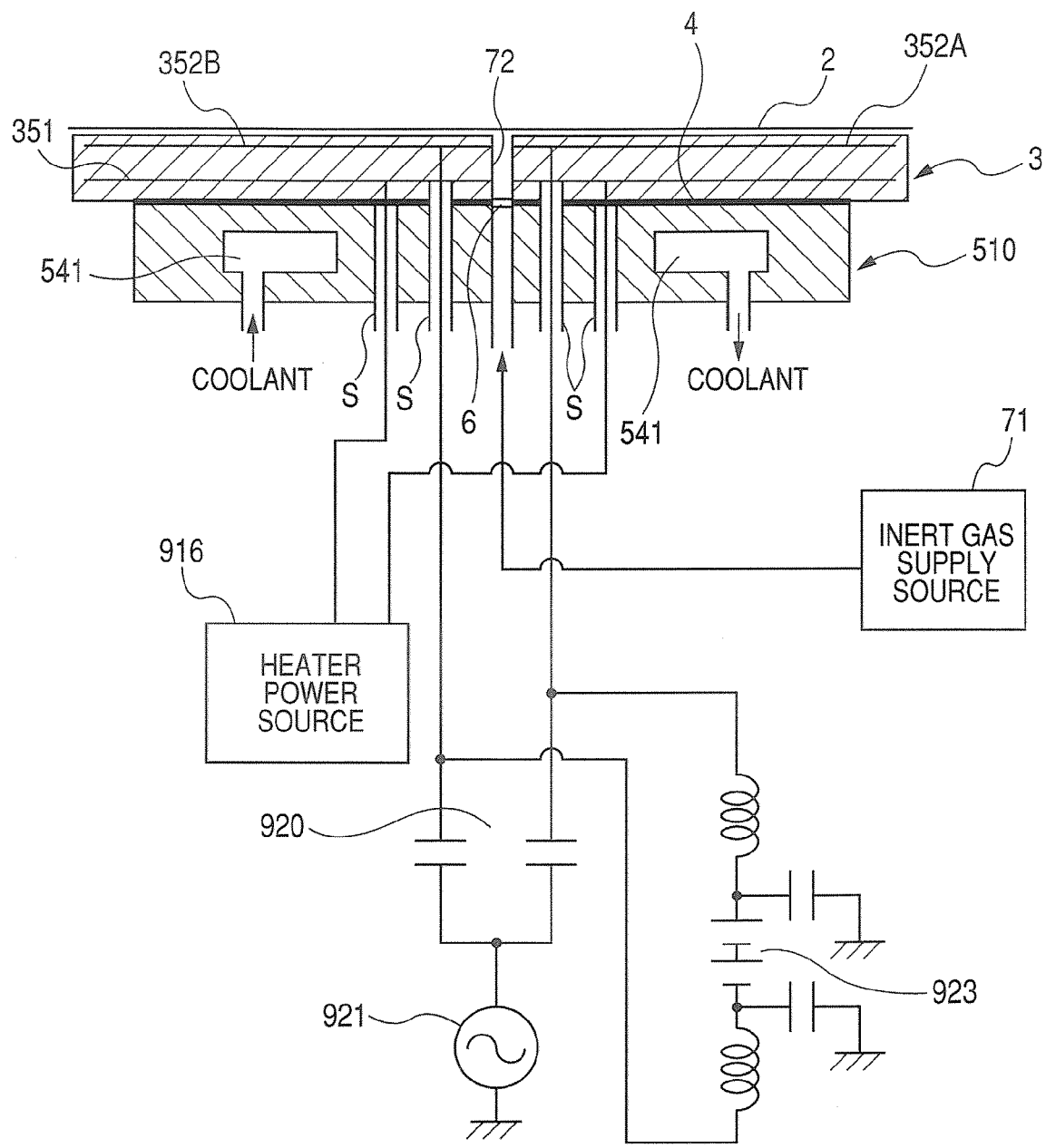
FIG. 6 is a schematic diagram illustrating a configuration of a substrate support device according to a second embodiment.

FIG. 6 is a schematic diagram illustrating a configuration of a substrate support device D according to a second embodiment. The same components as those in the first embodiment are given the same reference numerals.

As illustrated in FIG. 6, in the second embodiment, both heating and cooling means are provided to heat and cool the substrate 2. Specifically, a cooling path 541 as the cooling means is provided inside the base table 510. Coolant is circulated to the cooling path 541 to enable the base table 510 to be cooled. A resistive heating element 351 as the heating means, formed of metal high in melting-point such as, for example, molybdenum or tungsten, is provided inside the electrostatic chuck 3. Supplying electric power to the resistive heating element 351 allows heating the electrostatic chuck 3.

Inside the electrostatic chuck 3 and the base table 510, there is further provided a flow path 72 for supplying the inert gas to the vicinity of the center of rear surface of the substrate 2. The intermediate member 4 formed of a single carbon sheet uniform in thickness is interposed between the electrostatic chuck 3 and the base table 510 and the micro bellows 6 is disposed at a portion forming the flow path 72 of the intermediate member 4.

Thus, the single flow path 72 may be provided, in addition, the heating means may be provided on the side of the electrostatic chuck 3 and the cooling means may be provided on the side of the base table 510.

The electrostatic chuck 3 in FIG. 6 is of bipolar adsorption type. A pair of sheet electrodes 352A and 352B is connected to a DC power source 923 and supplied with a DC voltage for electrostatic adsorption. The electrodes 352A and 352B are connected to a high frequency power source 921 through a matching box 920 and supplied with a high frequency voltage for attracting plasma at the time of sputtering. Reference character S in FIG. 6 denotes an insulating sheath.

The substrate support device D of the second embodiment basically provides the same operational effect as that of the first embodiment. Even if the gap between the base table 510 and the electrostatic chuck 3 is varied by heating and cooling the substrate 2, carbon powder can be prevented from sticking to the rear surface of the substrate 2. Specifically, at the time of heating, the inert gas is circulated to the rear surface of the substrate 2 while the electrostatic chuck 3 is being heated by the resistive heating element 351, thereby increasing a heating effect. At the time of cooling, the coolant is circulated to the base table 510 and the inert gas is circulated to the rear surface of the substrate 2 to accelerate heat transfer from the substrate 2 to the electrostatic chuck 3, thereby increasing a cooling effect. Thus, even if the gap between the base table 510 and the electrostatic chuck 3 is varied by heating and cooling the substrate 2, the micro bellows 6 separate the flow path 72 of the inert gas from the carbon sheet, so that carbon powder can be prevented from sticking to the rear surface of the substrate 2.

The substrate support device D according to the above embodiments is not limited to those embodiments. For example, the aforementioned substrate support device D is applicable to a dry etching apparatus, a plasma usher apparatus, a CVD apparatus and a liquid crystal display producing apparatus as well as the sputtering apparatus exemplified as a plasma processing apparatus.

The heating means 520 may be provided not only in the base table 510, but also in the electrostatic chuck 3. Similarly, the cooling means may be provided in it, or, as it the case with the second embodiment, both the cooling and the heating means may be provided.

The intermediate member 4 is not limited to the mode in which a plurality of carbon sheets are stacked, but a single carbon sheet may be used with its outer periphery bent, a single carbon sheet partially different in thickness may be used, or three or more carbon sheets may be used which stepwise or gradually increase in thickness from the inner periphery to the outer periphery. In other words, the elastic coefficient can be made smaller in the inner side of the carbon sheet. The flow path for the inert gas may be formed only on the outer periphery or on the inner periphery. Furthermore, the micro bellows 6 is made different in elastic modulus and height between the inner and the outer periphery. For example, the micro bellows smaller in elastic modulus in the height direction may be used so that the inner periphery greater in deformation easily follows. In addition to the intermediate member 4, other sealing members may be arranged.

Figure 7:
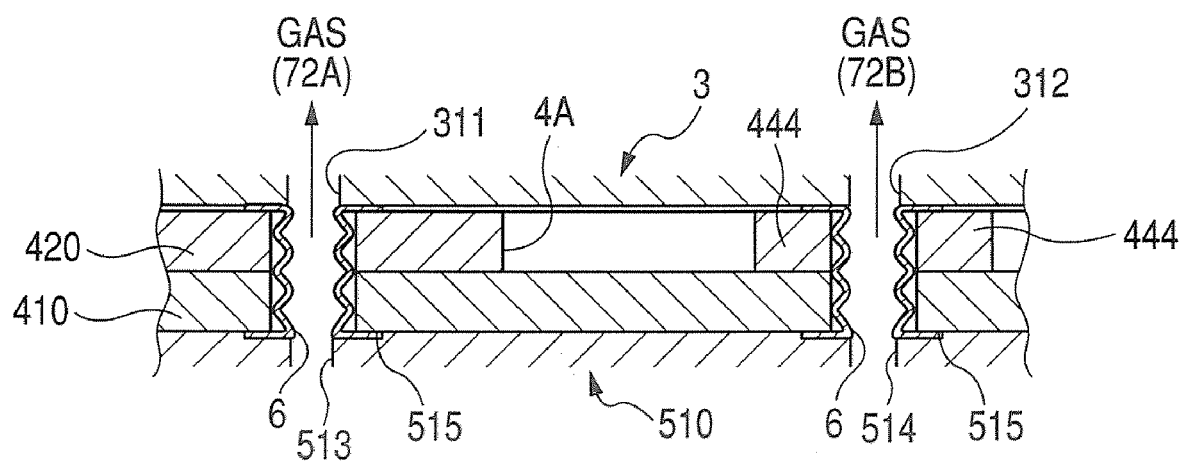
FIG. 7 is a schematic diagram illustrating another example of arrangement of carbon sheets.

As illustrated in FIG. 7, in order to provide a sealing function, an upper carbon sheet or another elastic body 444 equivalent to a portion required for performing a sealing function may be provided on the periphery of the micro bellows 6 forming the inner flow path 72B.

The invention claimed is:

1. A substrate support device provided with a structure for supplying an inert gas to a rear face of a substrate, comprising;
   a base table having a first aperture path which penetrates the base table and is communicated with a flow path of the inert gas,
   a thermoconductive intermediate member disposed on said base table and having a second aperture path which penetrates the thermoconductive intermediate member,
   a substrate support table disposed on said thermoconductive intermediate member and having a third aperture path which penetrates the substrate support table, and
   an elastic member including a hollow portion, the elastic member disposed in the second aperture path of said thermoconductive intermediate member and covering a side wall of the second aperture path so that the elastic member insulates said thermoconductive intermediate member from the inert gas which flows through the communication aperture path,
   wherein the hollow portion of the elastic member communicates with the first aperture path and the third aperture path so that the elastic member, the first aperture path, and the third aperture path form the flow path of the inert gas.

2. A substrate support device according to claim 1, wherein said elastic member is a tube-shaped member of leaf spring material.

3. A substrate support device according to claim 1, wherein said elastic member is a tube in bellows.

4. A substrate support device according to claim 1, wherein said thermoconductive intermediate member has an elasticity higher than elasticities of said base table and said substrate support table.

5. A substrate support device according to claim 1, wherein said thermoconductive intermediate member is made of carbon.

6. A substrate support device according to claim 1, wherein said thermoconductive intermediate member encloses the outside surface of said elastic member.

7. A substrate support device according to claim 1, wherein said elastic member has an elastic coefficient smaller than that of said thermoconductive intermediate member.

8. A substrate support device according to claim 1, wherein said substrate support table has an electrostatic adhesion mechanism for adhesively holding the substrate by an electrostatic force.

9. A plasma processing apparatus comprising a process chamber the inside atmosphere of which can be evacuated into a vacuum and the substrate support device according to claim 1 set inside the process chamber.

* * * * *